United States Patent
Wang et al.

(10) Patent No.: US 8,472,894 B2
(45) Date of Patent: Jun. 25, 2013

(54) SIGNAL TRANSMITTING/RECEIVING CIRCUIT INCLUDING AN IMPEDANCE MATCHING CIRCUIT

(75) Inventors: Po-Chih Wang, Kao-Hsiung (TW); Chia-Jun Chang, Taipei (TW)

(73) Assignee: Realtek Semiconductor Corp., Hsinchu (TW)

( * ) Notice: Subject to any disclaimer, the term of this patent is extended or adjusted under 35 U.S.C. 154(b) by 280 days.

(21) Appl. No.: 12/979,354

(22) Filed: Dec. 28, 2010

(65) Prior Publication Data
US 2011/0169587 A1 Jul. 14, 2011

Related U.S. Application Data

(60) Provisional application No. 61/295,137, filed on Jan. 14, 2010.

(30) Foreign Application Priority Data

Jul. 23, 2010 (TW) ................................ 99124297 A

(51) Int. Cl.
*H03C 1/52* (2006.01)

(52) U.S. Cl.
USPC .......... 455/107; 455/78; 455/248.1; 455/320; 327/356

(58) Field of Classification Search
USPC ................ 455/107, 78, 248.1, 320, 330, 453, 455/284; 327/356
See application file for complete search history.

(56) References Cited

U.S. PATENT DOCUMENTS

| | | | |
|---|---|---|---|
| 6,653,885 B2 * | 11/2003 | Wu et al. ........................ | 327/356 |
| 6,735,418 B1 * | 5/2004 | MacNally et al. .............. | 455/78 |
| 6,809,581 B2 * | 10/2004 | Rofougaran et al. .......... | 327/563 |
| 7,209,727 B2 * | 4/2007 | Castaneda et al. ............. | 455/341 |
| 7,236,802 B2 * | 6/2007 | Cairo .......................... | 455/556.1 |
| 7,283,793 B1 * | 10/2007 | McKay ........................... | 455/83 |
| 7,526,256 B2 * | 4/2009 | Bhatti et al. .................... | 455/73 |
| 7,616,934 B2 * | 11/2009 | Macphail ..................... | 455/248.1 |
| 7,868,482 B2 * | 1/2011 | Greene et al. ................... | 307/82 |
| 7,899,409 B2 * | 3/2011 | Huang et al. ..................... | 455/78 |
| 8,310,309 B2 * | 11/2012 | Behera et al. .................. | 330/260 |
| 2002/0163375 A1 * | 11/2002 | Wu et al. ......................... | 327/356 |
| 2006/0082517 A1 * | 4/2006 | Chung et al. ................... | 343/895 |
| 2011/0143690 A1 * | 6/2011 | Jerng et al. ...................... | 455/78 |
| 2011/0181376 A1 * | 7/2011 | Vanhille et al. ............... | 333/243 |

OTHER PUBLICATIONS

Chang, "A Fully Integrated RF Front-End with Independent RX/TX Matching and +20dBm Output Power for WLAN Applications", pp. 564-565 & 622, ISSCC 2007/SESSION31/WLAN/BLUETOOTH/31.4.

* cited by examiner

*Primary Examiner* — Minh D Dao
(74) *Attorney, Agent, or Firm* — McClure, Qualey & Rodack, LLP

(57) ABSTRACT

A signal transmitting/receiving circuit includes a transmitter, a receiver, a balun and an impedance matching circuit. The transmitter is utilized for transmitting an output signal. The receiver is utilized for receiving an input signal. The balun includes a first input terminal, a second input terminal and an output terminal. The impedance matching circuit, which is coupled between the transmitter, the receiver, and the balun, provides transmitting impedance when the transmitter transmits the output signal such that an output signal may be output at an output terminal of the balun via a transmitting path. Also, the impedance matching circuit provides transmitting impedance when the receiver receives the input signal such that the input signal may be transmitted from the output terminal of the balun to the receiver via a receiving path.

19 Claims, 5 Drawing Sheets

SIGNAL TRANSMITTING/RECEIVING CIRCUIT INCLUDING AN IMPEDANCE MATCHING CIRCUIT

CROSS REFERENCE TO RELATED APPLICATIONS

This application claims the benefit of U.S. provisional application No. 61/295,137, filed on Jan. 14, 2010 and incorporated herein by reference.

BACKGROUND OF THE INVENTION

1. Field of the Invention

The present invention relates to a signal transmitting/receiving circuit, and more particularly, to a signal transmitting/receiving circuit without using a transmitter/receiver switch for impedance matching.

2. Description of the Prior Art

A conventional signal transmitting/receiving circuit generally comprises a transmitter/receiver switch (T/R switch). As shown in FIG. 1, the transmitter 101 and the receiver 103 of the signal transmitting/receiving circuit 100 are often comprised in an integrated circuit (IC) package 105 (i.e., an IC). While the T/R Switch 107 is disposed outside of the IC package 105, and implemented for determining if a signal transmitting path or a signal receiving path is conductive. However, with the development of technology, an amplifier utilized for acting as a transmitter or a receiver is often manufactured via a complementary metal-oxide-semiconductor (CMOS) process. However, considering that the T/R Switch may introduce front-end loss, it is hard to be manufactured via CMOS process.

SUMMARY OF THE INVENTION

One of the objectives of the present invention is to provide a signal transmitting/receiving circuit without a T/R switch implemented therein.

Another of the objectives of the present invention is to provide a signal transmitting/receiving circuit having an impedance matching circuit included therein.

One exemplary embodiment of the present invention discloses a signal transmitting/receiving circuit, which comprises a transmitter, a receiver, a balun and an impedance matching circuit. The transmitter is utilized for transmitting an output signal. The receiver is utilized for receiving an input signal. The balun has a first input terminal, a second input terminal and an output terminal. The impedance matching circuit is coupled between the transmitter, the receiver and the balun, for providing transmitting impedance when the transmitter transmits the output signal such that the output signal is output at the output terminal of the balun via a transmitting path, and providing receiving impedance when the receiver receives the input signal such that the input signal is transmitted from the output terminal of the balun to the receiver via a receiving path.

According to the exemplary embodiment mentioned above, passive components, such as capacitors, inductors, bonding wires, etc., may be utilized for forming the required impedance matching network under a condition where no T/R switch is used.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
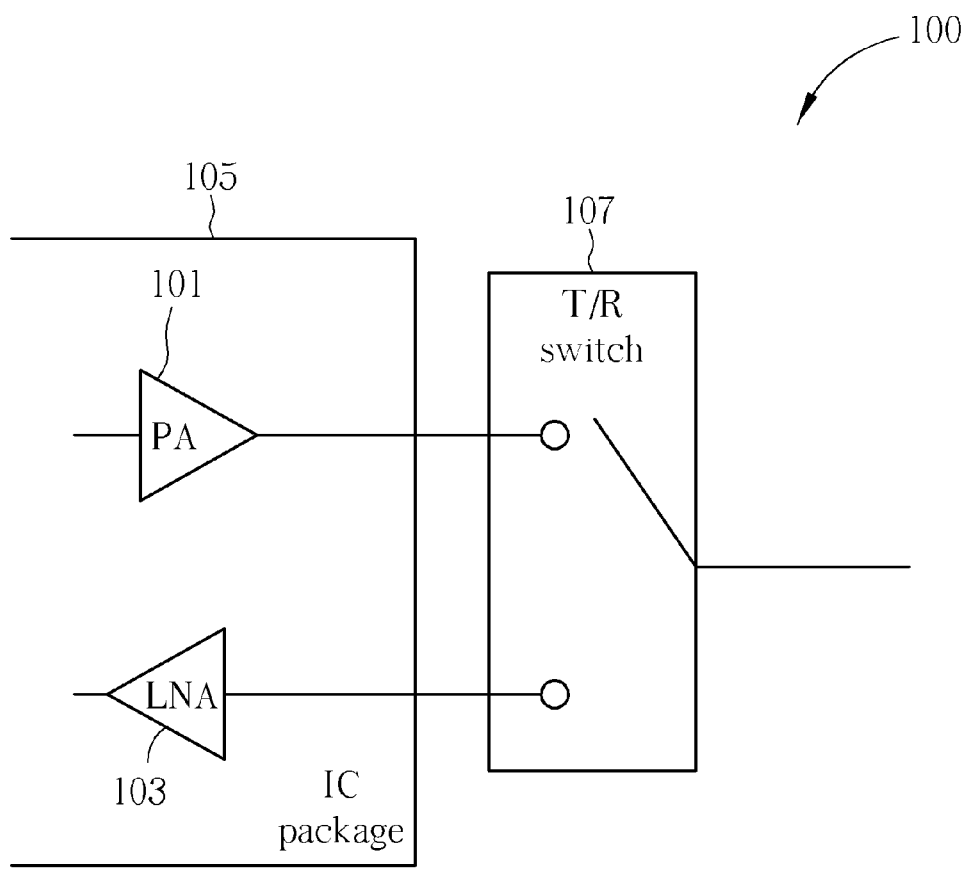
FIG. 1 is a diagram illustrating a conventional T/R switch.
Figure 2:
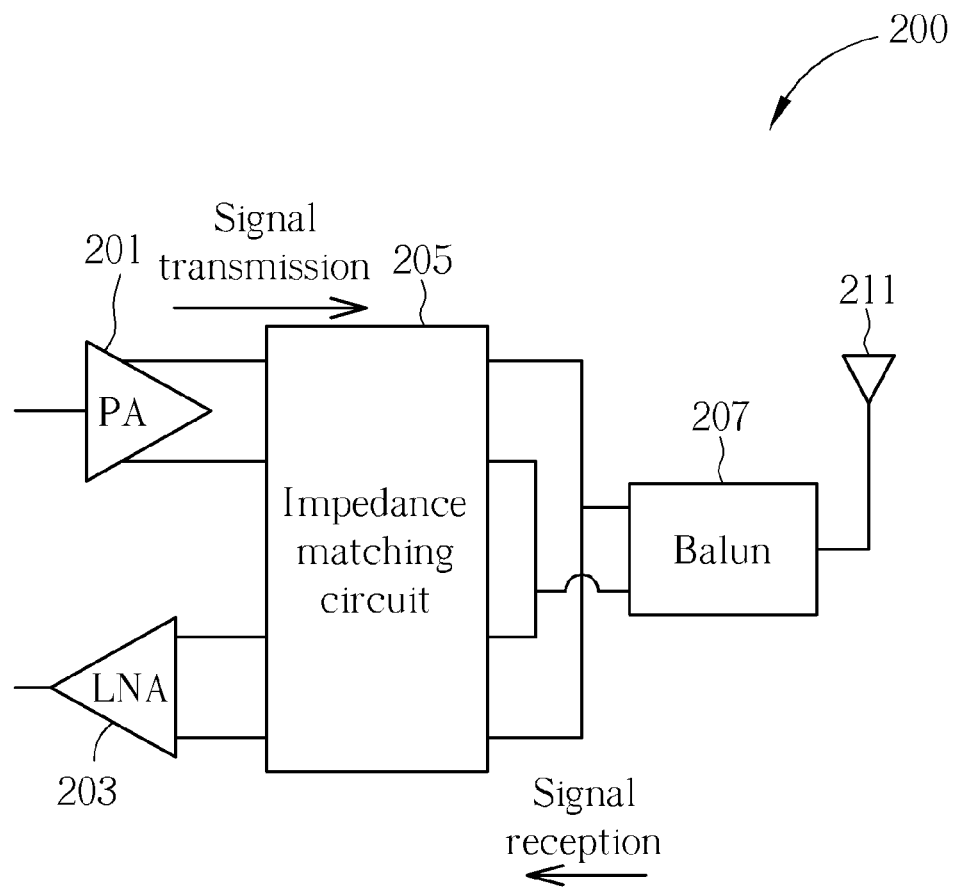
FIG. 2 is a block diagram illustrating a signal transmitting/receiving circuit according to an exemplary embodiment of the present invention.

FIG. 2 is a block diagram illustrating a signal transmitting/receiving circuit 200 according to an exemplary embodiment of the present invention. As shown in FIG. 2, the signal transmitting/receiving circuit 200 comprises a transmitter 201, a receiver 203, an impedance matching circuit 205, a balun 207 and an antenna 211. In this exemplary embodiment, the transmitter 201 and the receiver 203 are respectively shown as a power amplifier (PA) and a low noise amplifier (LNA). In other exemplary embodiments, the signal transmitting/receiving circuit 200 may further comprise a filter (not shown), disposed between the balun 207 and the antenna 211. The impedance matching circuit 205 and the balun 207 are disposed between the antenna 211 and the transmitter 201/receiver 203. The impedance matching circuit 205 provides impedance matching required by the transmitter 201 looking into the balun 207 and the antenna 211, and provides impedance matching required by the antenna 211 looking into the internal impedance of the signal transmitting/receiving circuit 200. Moreover, when the transmitter 201 transmits a signal and the receiver 203 receives a signal, the impedance matching circuit 205 further collaborates with the balun 207 to provide a transmitting path for the signal to be transmitted and a receiving path for the signal to be received. Moreover, the signal transmitting/receiving circuit 200 generally comprises a controller (not shown) for stopping the operation of the receiver 203 when the transmitter 201 transmits an output signal, and stopping the operation of the transmitter 201 when the receiver 203 receives an input signal.

Figure 3:
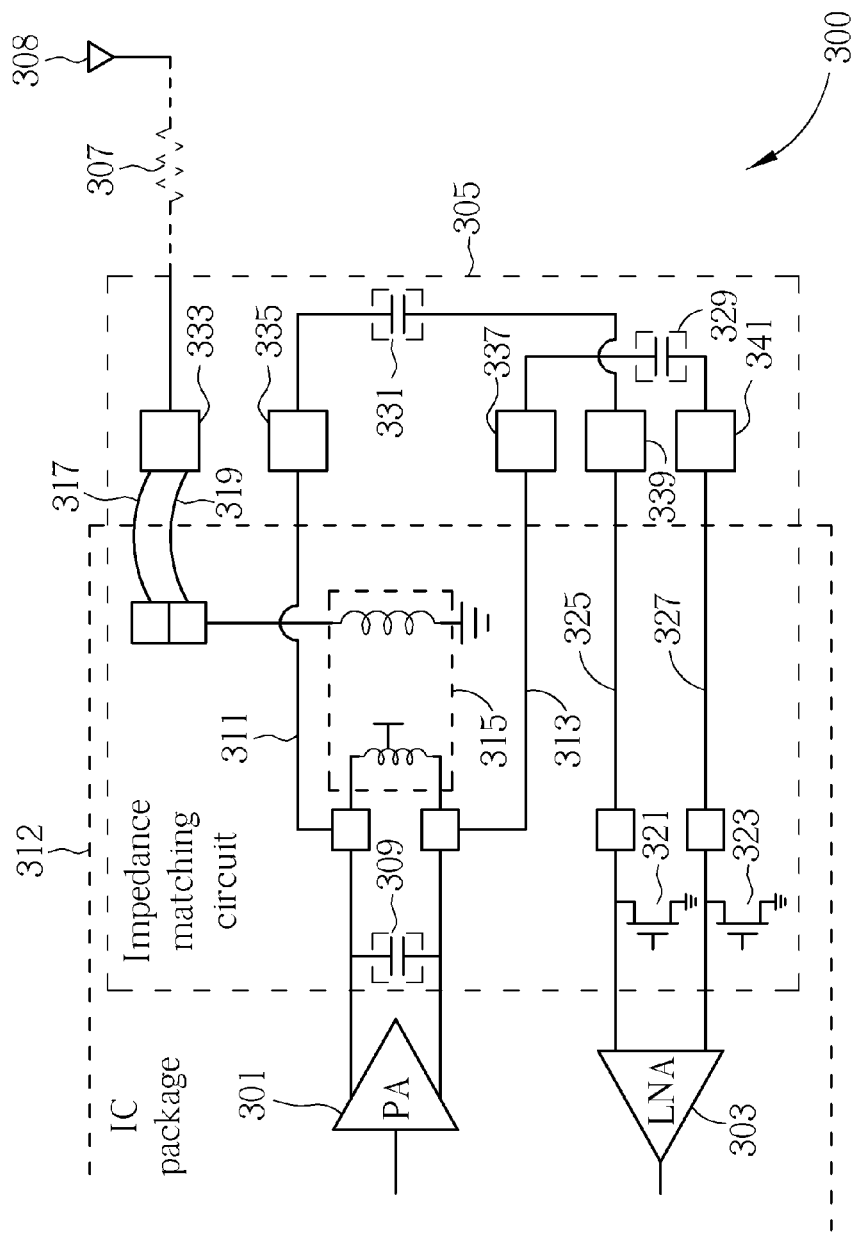
FIG. 3 is a detailed circuit diagram illustrating a signal transmitting/receiving circuit in the exemplary embodiment of the present invention.

FIG. 3 is a detailed circuit diagram illustrating a signal transmitting/receiving circuit in the exemplary embodiment of the present invention. In this exemplary embodiment, the impedance matching circuit 305 comprises a plurality of capacitors 309, 329 and 331, and a plurality of bonding wires 311, 313, 325 and 327 that are connected between the bonding pads and the components. The bonding wires 311 and 313 are disposed between the capacitors 309 and 331 and disposed between the capacitors 329 and 309, respectively; however, the number of the bonding wires is not limited to two. The capacitors 329 and 331 are disposed in the receiving path from the antenna 308 to the receiver 303. A transmitting path is composed of the capacitor 309, the balun 315, the bonding wires 317, 319 and the antenna 308. A receiving path is composed of the antenna 308, the bonding wires 317, 319, the balun 315, the bonding wires 311, 313, the capacitors 329, 331, and the bonding wires 325, 327, wherein the resistor 307 is utilized for representing equivalent resistance of a load of the transmitting/receiving circuit 300 that is viewed from the antenna 308 into the impedance matching circuit 305, the transmitter 301 and the receiver 303.

The impedance matching circuit 305 may further comprise at least one T/R switch 321/323 disposed in the receiving path from the antenna 308 to the receiver 303, and the T/R switch 321/323 is coupled between a predetermined potential (e.g., a ground potential in this exemplary embodiment) and the receiving path. The T/R switch 321/323 is grounded when switched on, thereby making the receiver 303 stay in an inactive state. In the actual manufacturing process of the circuit, the transmitter 301, the receiver 303, the capacitor 309, the bonding wires 311, 313, 317, 319, 325, 327, the balun 315, the T/R switches 321, 323 may be integrated in one IC package 312, and the IC package 312 is electrically connected to external bonding pads 333, 335, 337, 339, 341 via some signal outputting/receiving points (not shown). Please note that the exemplary embodiment shown in FIG. 3 is for illustrative purposes only, and by no means implies that the impedance matching circuit 305 has to include all the components shown in FIG. 3. In one exemplary embodiment, when the signal transmitting/receiving circuit 300 is operating under a transmitting mode (TX mode), the receiver 303 is disabled/inactive, and only the transmitter 301 is working normally. As the T/R switches 321 and 323 are switched on and coupled to the ground, the balun 315 and other components such as bonding wires and the capacitors provide high impedance for high-frequency signals when viewed by the transmitter 301. Thus, the output signal transmitted by the transmitter 301 will be output according to the predetermined transmitting path (i.e., from the output terminal of the balun 311 to the antenna 308). When the signal transmitting/receiving circuit 300 is operating under a receiving mode (RX mode), the transmitter 301 is disabled/inactive, and only the receiver 303 is working normally. As the transmitter 301 is regarded as high impedance for the input signal of the antenna 308, the signal is naturally guided toward the receiver 303. The balun 311 in this exemplary embodiment has the capability of converting a single-ended input to a differential output and converting one impedance value to another impedance value, such that the circuits disposed at different sides of the balun 315 may view required impedance values, respectively. The bonding wires 311, 313, 325, 327 have parasitic inductors. In this exemplary embodiment, most of the inductance values are at nH level, and most of the capacitance values are at pF level. However, it should be noted that the inductance values and the capacitance values may be freely adjusted when the circuit design is changed.

Figure 4:
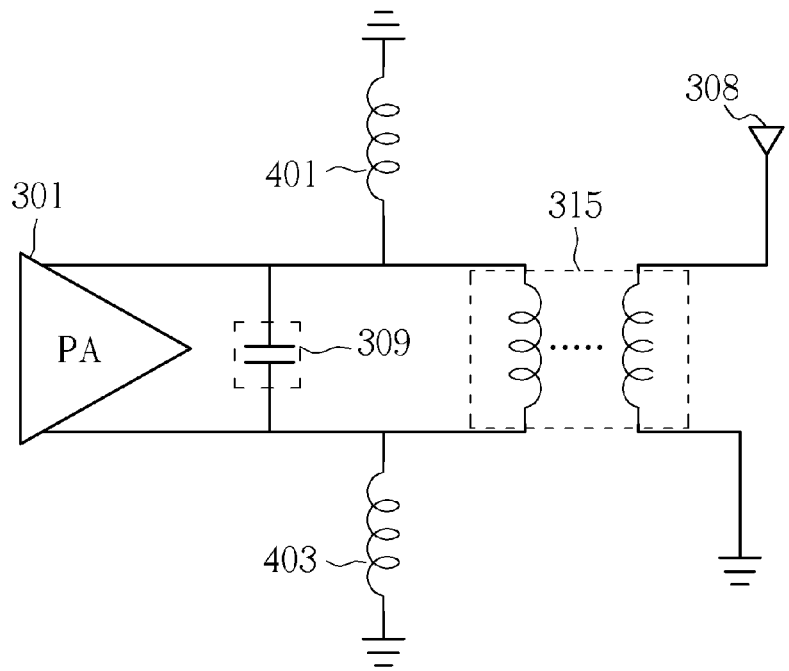
FIG. 4 is a diagram illustrating a first small-signal model of the signal transmitting/receiving circuit shown in FIG. 3.
Figure 5:
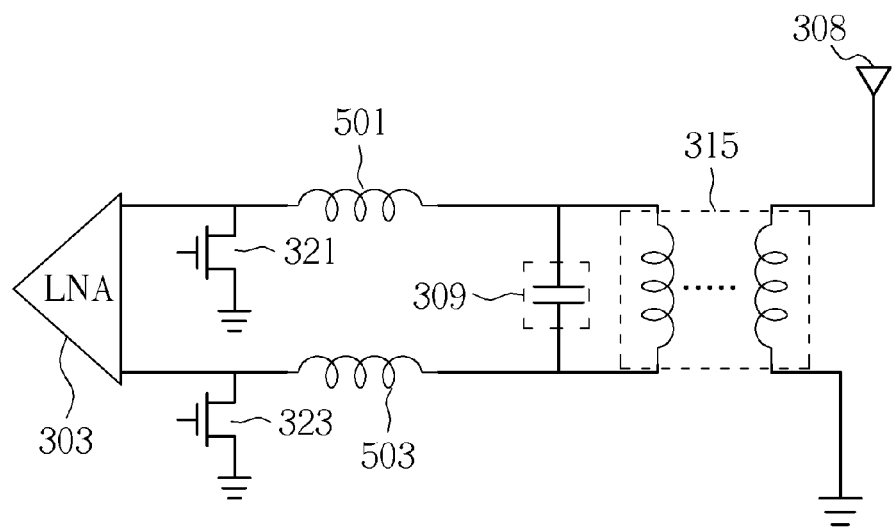
FIG. 5 is a diagram illustrating a second small-signal model of the signal transmitting/receiving circuit shown in FIG. 3.

FIG. 4 and FIG. 5 are diagrams illustrating small-signal models of the signal transmitting/receiving circuit shown in FIG. 3, wherein FIG. 4 illustrates a small-signal model for signal transmission, and FIG. 5 illustrates a small-signal model for signal reception. As shown in FIG. 4, when the signal transmitting/receiving circuit 300 is transmitting a signal, the T/R switches 321 and 323 are switched on such that the receiving path is coupled to the ground, the transmitter 301 is working normally, and the receiver 303 is disabled/inactive. At this moment, the capacitor 309 presents high impedance for high-frequency signals. The electrical characteristic of the bonding wires 311 and 325 is represented by an equivalent inductor 401, and the electrical characteristic of the bonding wires 313 and 327 is represented by an equivalent inductor 403. Thus, the signal output by the transmitter 301 is provided to the external antenna 308 via the balun 315, and the balun 315 further provides an impedance transform function to thereby respectively provide suitable impedance for the internal side and external side of the IC.

When the signal transmitting/receiving circuit 300 is receiving a signal, as shown in FIG. 5, the T/R switches 321 and 323 are switched off, the receiver 303 is working normally, and the transmitter 301 is disabled/inactive. When the signal is transmitted from the antenna 308 to the receiver 303, it is first processed by the balun 315. The electrical characteristics of the bonding wires 311, 313, 325 and 327 may be represented by equivalent inductors 501, 503, and the capacitors 329 and 331 are regarded to be conductive for the high-frequency signal, thereby allowing the signal to be fed into the receiver 303. As detailed signal transmitting manners may be readily known by referring to the structure shown in FIG. 3 and knowledge in other circuit-related field, further description is omitted here for brevity.

Figure 6:
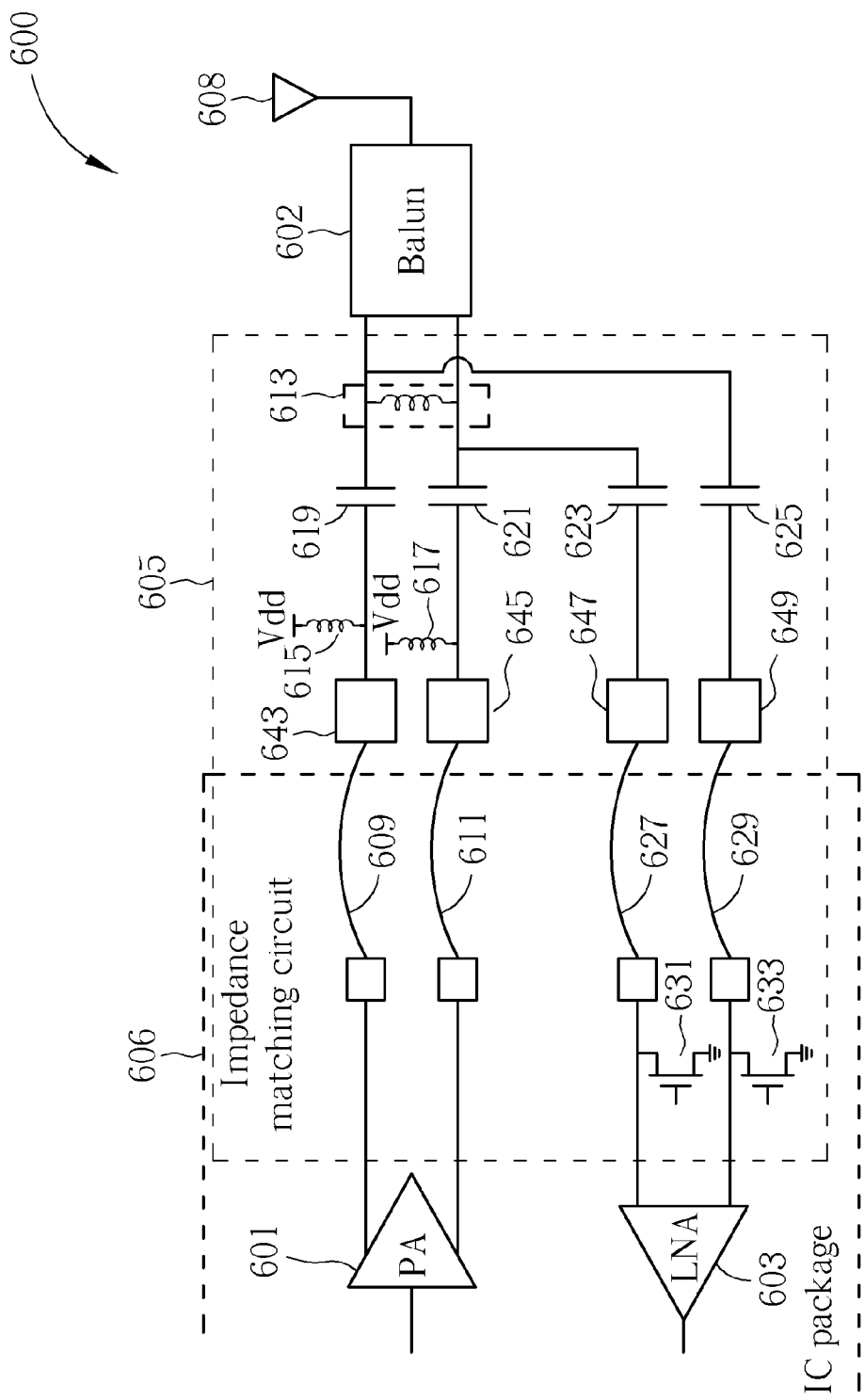
FIG. 6 is a circuit diagram illustrating a signal transmitting/receiving circuit according to another exemplary embodiment of the present invention.

FIG. 6 is a circuit diagram illustrating a signal transmitting/receiving circuit according to another exemplary embodiment of the present invention. In the signal transmitting/receiving circuit 600, the impedance matching circuit 605 comprises a plurality of capacitors 619 and 621, disposed in the transmitting path from the transmitter 601 to the antenna 608. The impedance matching circuit 605 may further comprise bonding wires 609, 611, disposed between the transmitter 601 and the capacitors 619, 621. Besides, the impedance matching circuit 605 may further comprise an inductor 613, disposed between the antenna 608 and the capacitors 619, 621. Moreover, the impedance matching circuit 605 may further comprise a plurality of capacitors 623, 625, disposed in the receiving path from the antenna 608 to the receiver 603. The impedance matching circuit 605 may further comprise a plurality of bonding wires 627, 629, disposed between the receiver 603 and the capacitors 623, 625. The transmitting path may comprise a transmitter 601, bonding wires 609, 611, the capacitors 619, 621, an inductor 613, a balun 602 and the antenna 608. The receiving path may comprise the antenna 608, the balun 602, the inductor 613, the capacitors 623, 625, and the bonding wires 627, 629.

Besides the aforementioned components, the impedance matching circuit 605 may further comprise inductors 615, 617 disposed in the transmitting path and T/R switches 631, 633 disposed in the receiving path. The inductors 615, 617 are utilized for acting as radio-frequency (RF) chock components. The T/R switches 631, 633 are coupled between a predetermined potential (e.g., a ground potential in this exemplary embodiment) and the receiving path. In an actual manufacturing process of the circuit, the transmitter 601, the receiver 603, the capacitors 619, 621, 623, 625, the bonding wires 609, 611, 627, 629, and the T/R switches 631, 633 may be integrated in one IC package 606, and the IC package 606 is electrically connected to bonding pads 643, 645, 647, 649 via signal outputting/inputting points (not shown) disposed thereon. In this exemplary embodiment, the balun 602 and the impedance matching circuit 605 are disposed on one IC substrate, while the transmitter 601 and the receiver 603 are disposed on another IC substrate. That is, the balun 602 and the impedance matching circuit 605 are integrated in one IC, while the transmitter 601 and the receiver 603 are integrated in another IC.

The operation of a small-signal model of the signal transmitting/receiving circuit 600 shown in FIG. 6 may be readily derived from referring to the well-known technologies, so it is omitted here for brevity. Please note that in the aforementioned exemplary embodiment, the impedance matching circuit is not required to have all components mentioned above, and may be configured to have part of the components mentioned above only.

According to the aforementioned exemplary embodiments, capacitors, inductors and/or bonding wires may be utilized for realizing the impedance matching network without using a T/R switch for impedance matching.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal transmitting and receiving circuit, comprising:
a transmitter, for transmitting an output signal;
a receiver, for receiving an input signal;
a balun, having a first input terminal, a second input terminal and an output terminal; and
an impedance matching circuit, coupled between the transmitter, the receiver and the balun, for providing a transmitting impedance when the transmitter transmits the output signal such that the output signal is output at an output terminal of the balun via a transmitting path, and providing a receiving impedance when the receiver receives the input signal such that the input signal is transmitted from the output terminal of the balun to the receiver via a receiving path, wherein the impedance matching circuit further comprises at least one switch component coupled between the receiving path and a ground potential.

2. The signal transmitting and receiving circuit of claim 1, wherein the impedance matching circuit comprises a plurality of capacitors and a plurality of bonding wires.

3. The signal transmitting and receiving circuit of claim 2, wherein the impedance matching circuit further comprises a plurality of bonding pads, and the capacitors are coupled between the bonding pads.

4. The signal transmitting and receiving circuit of claim 1, further comprising an inductor, coupled between the first input terminal and the second input terminal of the balun.

5. The signal transmitting and receiving circuit of claim 1, further comprising:
an antenna, coupled to the output terminal of the balun.

6. The signal transmitting and receiving circuit of claim 1, wherein the transmitter, the receiver and the balun are disposed in a same integrated circuit (IC).

7. The signal transmitting and receiving circuit of claim 1, wherein the switch component is switched on when the transmitter transmits the output signal, and is switched off when the receiver receives the input signal.

8. The signal transmitting and receiving circuit of claim 1, wherein the switch component is coupled between the input terminal of the receiver and the ground potential.

9. A signal transmitting and receiving circuit, comprising:
a transmitter, for transmitting an output signal;
a receiver, for receiving an input signal;
a balun, having a first input terminal, a second input terminal and an output terminal;
an impedance matching circuit, coupled between the transmitter, the receiver and the balun, for providing a transmitting impedance when the transmitter transmits the output signal such that the output signal is output at an output terminal of the balun via a transmitting path, and providing a receiving impedance when the receiver receives the input signal such that the input signal is transmitted from the output terminal of the balun to the receiver via a receiving path; and
an inductor coupled between the first input terminal and the second input terminal of the balun.

10. The signal transmitting and receiving circuit of claim 9, wherein the impedance matching circuit comprises a plurality of capacitors and a plurality of bonding wires.

11. The signal transmitting and receiving circuit of claim 10, wherein the impedance matching circuit further comprises a plurality of bonding pads, and the capacitors are coupled between the bonding pads.

12. The signal transmitting and receiving circuit of claim 9, wherein the impedance matching circuit further comprises at least one switch component coupled between the receiving path and a ground potential.

13. The signal transmitting and receiving circuit of claim 12, wherein the switch component is switched on when the transmitter transmits the output signal, and is switched off when the receiver receives the input signal.

14. The signal transmitting and receiving circuit of claim 12, wherein the switch component is coupled between the input terminal of the receiver and the ground potential.

15. The signal transmitting and receiving circuit of claim 9, further comprising an antenna coupled to the output terminal of the balun.

16. The signal transmitting and receiving circuit of claim 9, wherein the transmitter, the receiver and the balun are disposed in a same integrated circuit (IC).

17. A signal transmitting and receiving circuit, comprising:
a transmitter, for transmitting an output signal;
a receiver, for receiving an input signal;
a balun, having a first input terminal, a second input terminal and an output terminal;
an impedance matching circuit, coupled between the transmitter, the receiver and the balun, for providing a transmitting impedance when the transmitter transmits the output signal such that the output signal is output at an output terminal of the balun via a transmitting path, and providing a receiving impedance when the receiver receives the input signal such that the input signal is transmitted from the output terminal of the balun to the receiver via a receiving path, wherein the transmitter, the receiver and the balun are disposed in a same integrated circuit (IC).

18. The signal transmitting and receiving circuit of claim 17, wherein the impedance matching circuit comprises a plurality of capacitors and a plurality of bonding wires.

19. The signal transmitting and receiving circuit of claim 18, wherein the impedance matching circuit further comprises a plurality of bonding pads, and the capacitors are coupled between the bonding pads.

* * * * *